United States Patent

Jung et al.

[19]

[11] Patent Number: 5,976,961
[45] Date of Patent: Nov. 2, 1999

[54] METHOD OF FORMING A POLYCIDE LAYER IN A SEMICONDUCTOR DEVICE

[75] Inventors: Sung Hee Jung; Chung Tae Kim, both of Seoul, Rep. of Korea

[73] Assignee: Hyundai Electronics Industries Co., Ltd., Kyungki-do, Rep. of Korea

[21] Appl. No.: 08/876,733

[22] Filed: Jun. 16, 1997

[30] Foreign Application Priority Data

Jun. 21, 1996 [KR] Rep. of Korea ................. 96-22799

[51] Int. Cl.⁶ ..................... H01L 25/00; C23C 16/24
[52] U.S. Cl. .................... 438/592; 438/657; 438/684; 438/761; 427/58; 427/255
[58] Field of Search ................... 427/58, 574, 578, 427/255, 255.7, 419.7; 257/755, 756, 591, 412; 438/592, 657, 684, 761

[56] References Cited

U.S. PATENT DOCUMENTS

| | | | |
|---|---|---|---|
| 5,112,435 | 5/1992 | Wang et al. | 156/643 |
| 5,147,820 | 9/1992 | Chittipeddi et al. | 437/193 |
| 5,190,886 | 3/1993 | Asahina . | |
| 5,198,382 | 3/1993 | Campbell et al. | 437/46 |
| 5,571,735 | 11/1996 | Mogami et al. | 437/41 |
| 5,576,572 | 11/1996 | Maeda et al. | 257/378 |
| 5,641,983 | 6/1997 | Kato et al. | 257/412 |

*Primary Examiner*—Shrive Beck
*Assistant Examiner*—Bret Chen
*Attorney, Agent, or Firm*—Scott C. Harris, Esq.

[57] ABSTRACT

The method of forming a polycide layer in a semiconductor device is provided. The method of forming a polycide layer comprises the steps of depositing a doped polysilicon layer on a silicon substrate on which an insulating layer is formed and depositing a tungsten silicide on the doped polysilicon layer, the doped polysilicon layer comprises a lower, intermediate and upper doped polysilicon layers sequentially formed, also the intermediate polysilicon layer has a lower concentration of impurity ion than the upper and lower polysilicon layers. The impurity ions contained within the upper and lower polysilicon layers are diffused into the intermediate layer having the lowest concentration of impurity during a subsequent annealing process, therefore the impurity ions contained within the upper and lower polysilicon layers are not diffused to the junction and the tungsten silicide.

4 Claims, 2 Drawing Sheets

METHOD OF FORMING A POLYCIDE LAYER IN A SEMICONDUCTOR DEVICE

BACKGROUND OF THE INVENTION

1. Field of the Invention

The present invention relates to a method of forming a polycide layer in a semiconductor device and, more particularly, to a method of forming a polycide layer in a semiconductor device which can prevent an external diffusion of impurity ions contained in a doped polysilicon layer so that an electrical characteristic of device can be improved.

2. Description of the Prior Arts

In comparing with a polysilicon, a tungsten silicide layer ($WSi_x$) used for a wiring in a manufacturing process of a semiconductor device has excellent electrical specific resistance and thermal stability. Therefore, in case where any other fire-resistive metal compounds can not be used due to a subsequent high temperature process, the tungsten silicide layer may be used as a local interconnection materials. However, since the tungsten silicide layer has a poor adhesive force with an oxide, in most case, a polycide structure in which a tungsten silicide layer is deposited on a polysilicon is used.

As an example of a conventional method of forming a polycide layer in a semiconductor device, a method of forming a bit line will be now explained as follows.

FIG. 1 and FIG. 3 are cross-sectional views of device for explaining a conventional method of forming a polycide layer in a semiconductor device.

Referring to FIG. 1, an insulating layer 3 is formed on a silicon substrate 1 in which a junction 2 is formed, the insulating layer 3 is patterned to expose the junction 2 and thus a contact hole is formed. Then, a doped polysilicon layer 4 is deposited on the entire structure, a tungsten silicide layer 5 is deposited on the doped polysilicon layer 4. Therefore, a polycide layer 6 consisted of the doped polysilicon layer 4 and the tungsten silicide layer 5 is formed.

Here, the polycide layer 6 may be formed by means of two methods. The doped polysilicon layer 4 and the tungsten silicide layer 5 are deposited in in-situ method in an apparatus under vacuum, or the doped polysilicon layer 4 and the tungsten silicide layer 5 are deposited in different apparatuses, respectively. However, in case of the former, if the doped polysilicon layer 4 and the tungsten silicide layer 5 are experienced with a subsequent annealing process, impurity ions 7 such as phosphorous (P) contained within the doped polysilicon layer 4 will be diffused into the junction 2 and the tungsten silicide layer 5 as shown in FIG. 2 which is an enlarged view of the A portion in FIG. 1. Therefore, due to the diffusion of the impurity ions 7, the depth of the connection 2 will be altered. In addition, since the impurity ions 7 penetrated into the grain boundary of the tungsten silicide layer 5 resists a flow of current during operation of the device, the resistance of the tungsten silicide layer 5 will be increased.

Also, in case of the latter, a pre-cleaning process is performed after depositing the doped polysilicon layer 5, and then the tungsten silicide layer 5 is deposited. Therefore, an oxide film 8 is formed between the doped polysilicon layer 4 and the tungsten silicide layer 5 as shown in FIG. 3. During a subsequent annealing process, although the diffusion of the impurity ions 7 can be prevented by the oxide film 8, the steps of the process will become complicated, thereby lowering the yield.

SUMMARY OF THE INVENTION

It is therefore an object of the present invention to provide a method of forming a POLYCIDE layer in a semiconductor device which can overcome the above problems by forming a plurality of doped polysilicon layers which has an intermediate layer with a relative lower concentration of the impurity.

In order to achieve the object mentioned above, a method of forming a polycide layer in a semiconductor device comprising the step of sequentially forming an insulating layer and a doped polysilicon layer on a silicon substrate with said doped polysilicon layer having a lower portion, an intermediate portions and an upper portion of which concentration of impurity ion are different from each other, wherein the impurity concentration of said intermediate portion is lower than the impurity concentration of said lower portion and said upper portion and said upper portion; and depositing a tungsten silicide layer on said doped polysilicon layer.

BRIEF DESCRIPTION OF THE DRAWINGS

Other objects and advantages of the present invention will be understood by reading the detailed explanation of the embodiment with reference to the accompanying drawings in which.

DESCRIPTION OF THE INVENTION

Figure 1:
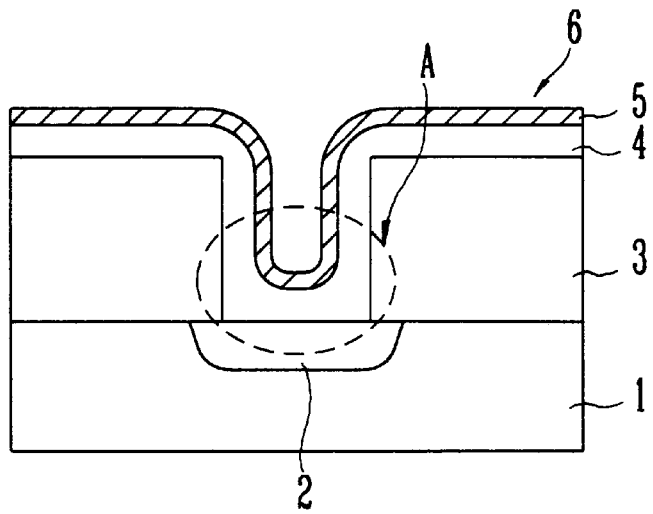
FIG. 1 and FIG. 3 are cross-sectional views of devices for explaining a conventional method of forming a polycide layer in a semiconductor device.
Figure 2:
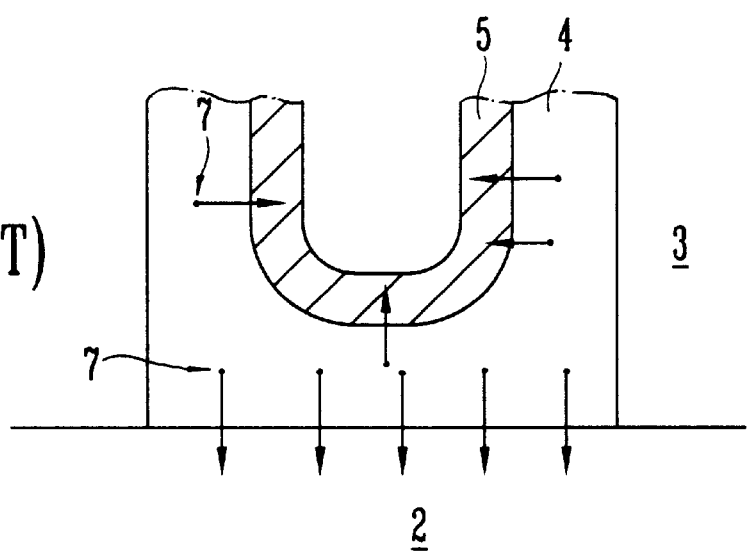
FIG. 2 is an enlarged view of the A portion in FIG. 1.
Figure 3:
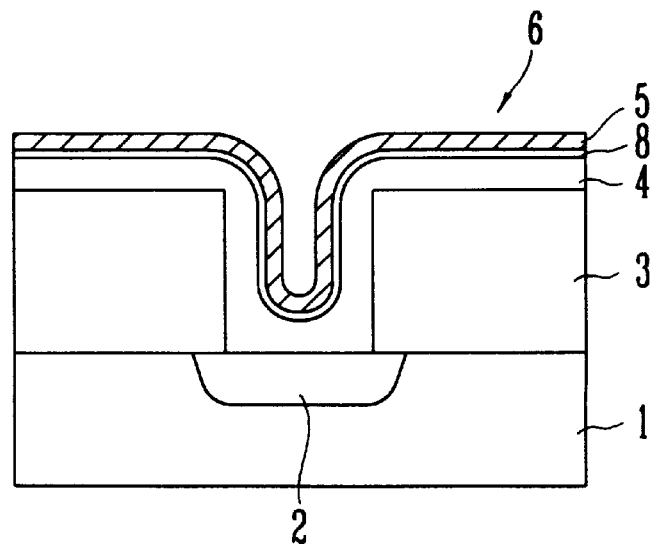
Figure 4A:
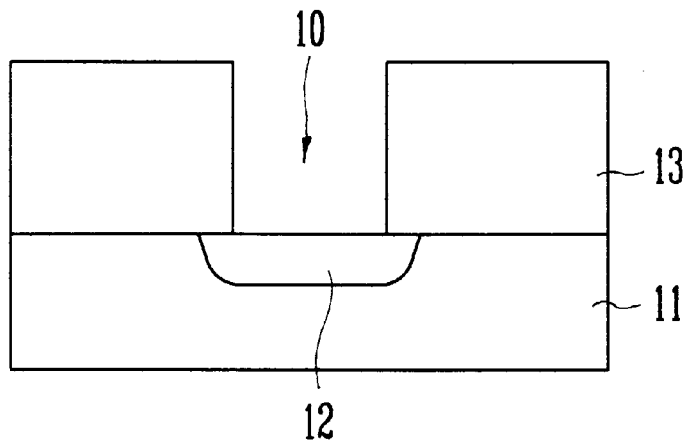
FIGS. 4A, 4B, and 4C are cross-sectional views of device for explaining a method of forming a polycide layer in a semiconductor device according to the present invention.

Referring to FIG. 4A, an insulating layer 13 in formed on a silicon substrate 11 in which a junction 12 is formed, the insulating layer 13 is then patterned to expose the junction 12, thereby forming a contact hole 10.

Figure 4B:
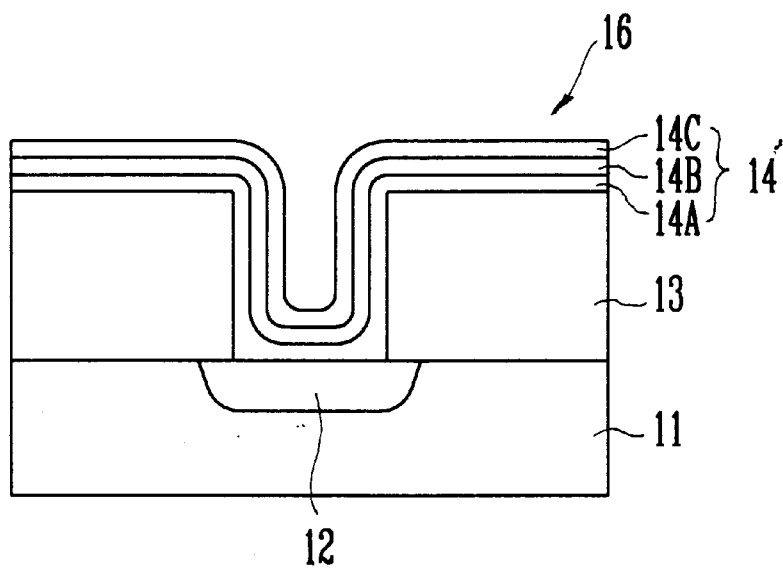

FIG. 4B shows that a doped polysilicon layer 14 is formed on the insulating layer 13. The doped polysilicon layer 14 is consisted of a first (lower), a second (intermediate) and a third (upper) doped polysilicon layers 14A, 14B and 14C which are sequentially formed on the entire structure including the contact hole 10. The first doped polysilicon layer 14A have a first concentration impurity ion. The second doped polysilicon layer 14B have a second concentration of impurity ion. The third doped polysilicon layer 14C have a third concentration of impurity ion. The second concentration of impurity ion of the second doped polysilicon layer 14B is lower than the first concentration of impurity ion of the first doped polysilicon layer 14A and the third concentration of impurity ion of the third doped polysilicon layer 14C.

Figure 4C:
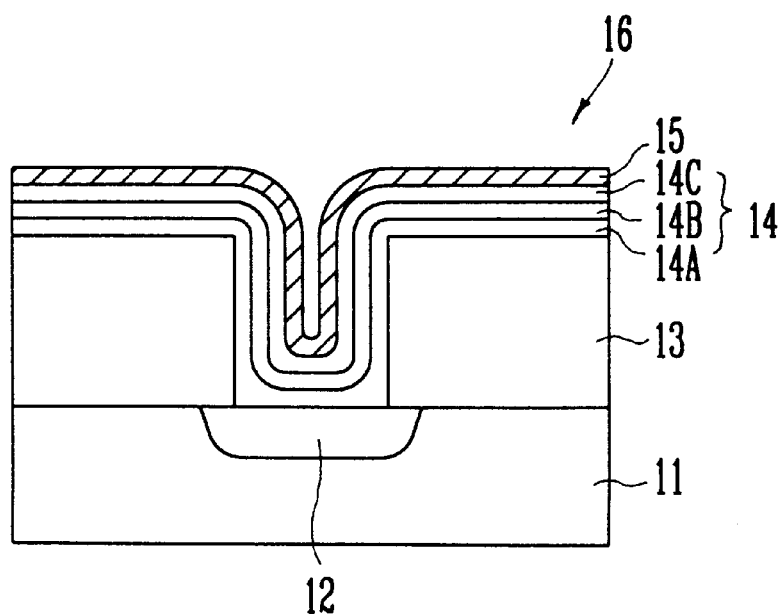

In FIG. 4C, a tungsten silicide layer 15 is deposited on the third doped polysilicon layer 14C in an in-situ method, thus, a polycide layer 16 consisted of the doped polysilicon layer 14 (14A, 14B and 14C) and the tungsten silicide layer 15 is formed.

In principle, elements move from a high concentration portion to a low concentration portion for a concentration equilibrium within a film. Therefore, the present invention uses this principle.

That is, the doped polysilicon layer 14 in the present invention is divided into a lower portion 14A, an intermediate portion 14B and an upper portion 14C of which concentration of impurity ion are different from each other. The impurity concentration of the intermediate portion 14B of the doped polysilicon layer 14 is lower than the impurity concentration of the lower and upper portion 14A and 14C of the doped polysilicon layer 14. As a result, during a subsequent annealing process performed after forming the polycide layer 16, the impurity ion contained in the upper and lower polysilicon layers 14A and 14C are diffused into the intermediate polysilicon layer 14A having the lowest concentration of impurity, therefore, a diffusion of the impurity ion into the junction 12 and tungsten silicide layer 15 can be prevented.

As mentioned above, during a subsequent annealing process preformed after forming the polycide layer consisted of the tungsten silicide layer and the doped polysilicon layer, since a diffusion of the impurity ions will occur only within a doped polysilicon layer, a depth of the junction is not altered, and a resistance of a tungsten silicide layer is not increased.

The foregoing description, although described in its preferred embodiments with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A method of forming a polycide layer in a semiconductor device, comprising:

sequentially forming a first doped polysilicon layer having a first concentration of impurity ion, a second doped polysilicon layer having a second concentration of impurity ion and a third doped polysilicon layer having a third concentration of impurity ion on an insulating layer including a contact hole, wherein said second concentration of impurity ion of said second doped polysilicon layer is lower than the first concentration of impurity ion of said first doped polysilicon layer and the third concentration of impurity ion of said third doped polysilicon layer; and depositing a tungsten silicide layer on said third doped polysilicon layer.

2. The method of claim 1, wherein said impurity ion is phosphorous.

3. A method of forming a polycide layer in a semiconductor device, comprising:

sequentially forming an insulating layer and a doped polysilicon layer on a silicon substrate with said doped polysilicon layer having a lower portion, an intermediate portion and an upper portion of which concentration of impurity ion which are different from each other, wherein the impurity concentration of said intermediate portion is lower than the impurity concentration of said lower portion and said upper portion; and depositing a tungsten silicide layer on said doped polysilicon layer.

4. A method as in claim 3, wherein said impurity ion is phosphorous.

* * * * *